(12) United States Patent
Bernds et al.

(10) Patent No.: US 6,852,583 B2
(45) Date of Patent: Feb. 8, 2005

(54) METHOD FOR THE PRODUCTION AND CONFIGURATION OF ORGANIC FIELD-EFFECT TRANSISTORS (OFET)

(75) Inventors: Adolf Berndts, Baiersdorf (DE); Wolfgang Clemens, Puschendorf (DE); Walter Fix, Furth (DE); Henning Rost, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/332,140

(22) PCT Filed: Jun. 27, 2001

(86) PCT No.: PCT/DE01/02377

§ 371 (c)(1),
(2), (4) Date: Jan. 6, 2003

(87) PCT Pub. No.: WO02/05360

PCT Pub. Date: Jan. 17, 2002

(65) Prior Publication Data

US 2003/0190767 A1 Oct. 9, 2003

(30) Foreign Application Priority Data

Jul. 7, 2000 (DE) .......................................... 100 33 112

(51) Int. Cl.⁷ .......................................... H01L 438/197
(52) U.S. Cl. ........................... 438/197; 438/82; 438/90; 438/99; 257/40
(58) Field of Search ............................. 438/21, 82, 90, 438/99, 197; 257/40

(56) References Cited

U.S. PATENT DOCUMENTS

| | | | |
|---|---|---|---|
| 4,340,657 A | * | 7/1982 | Rowe .......................... 430/56 |
| 5,364,735 A | * | 11/1994 | Akamatsu et al. ..... 430/270.12 |
| 5,705,826 A | | 1/1998 | Aratani et al. |
| 6,150,668 A | * | 11/2000 | Bao et al. ..................... 257/40 |
| 6,197,663 B1 | * | 3/2001 | Chandross et al. ......... 438/455 |
| 6,221,553 B1 | * | 4/2001 | Wolk et al. ................. 430/200 |
| 6,329,226 B1 | * | 12/2001 | Jones et al. ................. 438/151 |
| 6,330,464 B1 | * | 12/2001 | Colvin et al. ............... 600/316 |
| 6,362,509 B1 | * | 3/2002 | Hart ........................... 257/369 |
| 6,498,114 B1 | * | 12/2002 | Amundson et al. ......... 438/780 |
| 6,555,840 B1 | * | 4/2003 | Hudson et al. ............... 257/40 |
| 6,593,690 B1 | * | 7/2003 | McCormick et al. ....... 313/506 |
| 6,603,139 B1 | * | 8/2003 | Tessler et al. ................ 257/40 |
| 6,621,098 B1 | * | 9/2003 | Jackson et al. ............... 257/40 |
| 2002/0053320 A1 | * | 5/2002 | Duthaler et al. ............ 118/249 |

FOREIGN PATENT DOCUMENTS

| | | | |
|---|---|---|---|
| DE | 198 51 703 | 5/2000 | |
| EP | 0786820 A2 | * 1/1997 | ........... H01L/51/20 |
| EP | 0 786 820 | 7/1997 | |
| WO | WO 99/39373 | 8/1999 | |

OTHER PUBLICATIONS

Hebner et al. "Ink–jet printing of doping polymers for organic light emitting devices" Applied Phy. Letters vol.. 72 No. 5, Feb. 2, 1998 p. 519–521.*
Patent Abstracts of Japan, vol. 1997, 07, Jul. 31, 1997 & JP 09 083040 Mar. 28, 1997.

(List continued on next page.)

Primary Examiner—Matthew Smith
Assistant Examiner—Granvill D. Lee, Jr.
(74) Attorney, Agent, or Firm—Carella Byrne Bain Gilfillan Cecchi et al.; Elliot Olstein; William Squire

(57) ABSTRACT

The invention relates to an economical and precise method for the production and configuration of an organic field-effect transistor (OFET) whereby the solubility of at least one functional polymer of an OFET is utilized to such a degree, that the functional polymer is deposited on the OFET, or a substrate, by means of a conventional printing process as for a color.

10 Claims, 2 Drawing Sheets

OTHER PUBLICATIONS

J. A. Rogers et al., "Printing Process Suitable for Reel–to–Reel Production of High–Performance Organic Transistors and Circuits", Advanced Materials, VCH Verlagsgesellschaft, Weinheim, DE, vol. 11, No. 9, Jul. 5, 1999, pp 741–745.

F. Garnier et al., "All–Polymer Field–Effect Transistor Realized by Printing Techniques", Science, American Association for the Advancement of Science, US, vol. 265, Sep. 16, 1994, pp 1684–1686.

Z. Bao et al, "High–Performance Plastic Transistors Fabricated by Printing Techniques", Chem. Mater. vol. 9, No. 6, 1997, pp 1299–1301.

C.J. Drury et al., "Low–cost all–polymer integrated circuits", Applied Physics Letters, vol. 73, No. 1, Jul. 6, 1998, pp 108–110.

M. Angelopoulos et al., "In–Situ Radiation Induced Doping", Mol. Cryst. 1990, vol. 189, pp. 221–225.

U.S. Appl. No. 10/332,140, Method for the Production and Configuration of Organic Field Effect Transistors (OFET), Adolf Bernds et al.

U.S. Appl. No. 10/334,951, Organic Field–Effect Transistor (OFET), A Production Method Therefor, An Integrated Circuit Constructed From the Same and Their Uses, Adolf Bernds et al.

U.S. Appl. No. 10/362,932, Organic Field Effect Transistor, Method for Structuring an OFET and Integrated Circuit, Adolf Bernds et al.

U.S. Appl. No. 10/380,133, Organic Rectifier, Circuit, RFID Tag and Use of an Organic Rectifier, Adolf Bernds et al.

U.S. Appl. No. 10/380,206, Organic Memory, Identification Marker (RFID–TAG) with Organic Memory and Uses of an Organic Memory, Adolf Bernds et al.

U.S. Appl. No. 10/381,032, Electrode and/or Conductor Track for Organic Components and Production Method Thereof, Adolf Bernds et al.

U.S. Appl. No. 10/433,959, Organic Field Effect Transistor, Method For Structuring an OFET and Integrated Circuit, Adolf Bernds.

U.S. Appl. No. 10/433,961, Device For Detecting and/or Transmitting at Least One Envirinmental Influenece, Method for Producing Said Device and Use Thereof, Wolfgang Clemens et al.

U.S. Appl. No. 10/467,636, Organic Field Effect Transistor With a Photostructured Gate Dielectric, Method for the Production and Use Thereof in Organic Electronics, Adolf Bernds et al.

U.S. Appl. No. 10/473,050, Device with At Least Two Organic Electronic Components and Method for Producing the Same, Adolf Bernds et al.

U.S. Appl. No. 10/479,234, Organic Field Effect Transistor, Method for Production and Use Thereof in the Assembly of Integrated Circuits, Adolf Bernds et al.

U.S. Appl. No. 10/479,238, Method For Producing Conductive Structures by Means of Printing Technique, and Active Components Produced Therefrom For Integrated Circuits, Adolf Bernds et al.

U.S. Appl. No. 10/492,922, Insulator for An Organic Electronic Component, Erwann Guillet et al.

U.S. Appl. No. 10/492,923, Electronic Unit, Circuit Design for the Same and Production Method, Wolfgang Clemens et al.

U.S. Appl. No. 10/498,610, Organic Field Effect Transistor with Offset Threshold Voltage and Use Thereof, Walter Fix et al.

* cited by examiner

METHOD FOR THE PRODUCTION AND CONFIGURATION OF ORGANIC FIELD-EFFECT TRANSISTORS (OFET)

BACKGROUND OF THE INVENTION

The invention relates to a method for producing and patterning organic field-effect transistors (OFETs).

Polymeric integrated circuits based on OFETs are used for microelectronic mass applications and disposal products such as identification and product tags. A tag is e.g. an electronic bar code of the kind provided on merchandise or on luggage. In this case, the excellent operating behavior of silicon technology can be dispensed with, but by the same token low producing costs and mechanical flexibility should be ensured. The devices such as e.g. electronic bar codes are typically disposable products and are of interest economically only if they are produced in inexpensive processes.

To date, owing to the production costs, only the conductor layer of the OFET has been patterned since the patterning can only be realized using a two-stage process ("lithography method" cf. in this respect Applied Physics Letters 73(1), 1998, p. 108.110 and Mol. Cryst. Liq. Cryst. 189, 1990 p. 221–225) with firstly whole-area coating and subsequent patterning, which is material-specific, moreover. "Material specificity" means that the process described, with the photochemical components mentioned, only functions on the conductive polymer polyaniline. A different conductive polymer, e.g. polypyrrol, cannot readily be patterned in this way.

The lack of patterning of the other layers, such as the semiconducting layer and the insulating layer made of functional polymers, leads to a significant reduction in performance of the OFETs obtained, but it is dispensed with for cost reasons.

SUMMARY OF THE INVENTION

Therefore, it is an object of the invention to provide a cost-effective method, suitable for mass production, for producing and patterning OFETs, and an OFET which exhibits greater performance, because it is equipped with more patterned layers.

The invention relates to an organic field-effect transistor (OFET), comprising at least the following layers on a substrate:
  a semiconducting layer between a source electrode and a drain electrode,
  an insulation layer on above the semiconducting layer and
  a conductor layer,
the conductor layer and at least one of the other two layers being patterned. Moreover, the invention relates to a method for producing and patterning an OFET by printing at least one functional polymer onto a substrate, the functional polymer first being applied in an ink-like consistency and then being printed onto the substrate.

"Ink-like consistency" means that the functional polymers to be printed are comparable with conventional printing inks with regard to
  viscosity of the mixture ready for printing (determines the flow behavior)
  polymer concentration of the mixture ready for printing (determines the layer thickness)
  boiling point of the solvent (determines what printing method can be employed) and
  a surface tension of the mixture ready for printing (determines the wettability of the substrate or of other layers).

In principle, all printing methods by which color images are produced are also suitable for producing OFETs. It should be taken into account, however, that a sufficiently high resolution in the $\mu$m range is obtained.

In the case of pad printing using silicone pads, a high resolution is obtained which is suitable for patterning in the $\mu$m range.

In an advantageous manner, the functional polymers are brought to an ink-like consistency by introduction into solvents. By way of example, mixtures ready for printing are produced from the following functional polymers with the following solvents: polyaniline (electr. conductor) is dissolved in m-cresol; polythiophene (semiconductor) in chloroform and polyvinylphenol (insulator) in dioxan.

According to one refinement, firstly at least one dissolved functional polymer is filled into a "negative" of the layer to be printed on, by means of a doctor blade. With the aid of a pad (e.g. made of silicone), the shaped functional polymer is then removed from the negative mold, which is also called a block, and applied to the substrate and, if appropriate, to finished layers there.

According to a particularly advantageous refinement of the method, the production takes place by a continuous method, so that e.g. a pad roll firstly rolls over a block and loads the functional polymer there and, in the further continuous procedure, rolls over a substrate, onto which it unloads the functional polymer again, afterward it rolls over a block again and then over a substrate again.

Depending on the block, difference patterning processes can thus also be accommodated in a circulation of a large pad roll.

Electrical conductors (e.g. polyaniline), semiconductors (e.g. polythiophene) and insulators (e.g. polyvinylphenol) can be employed as functional polymers.

Layer construction and patterning of the OFET are realized simultaneously by virtue of the printing.

The invention will be explained in more detail below using an exemplary embodiment.

DESCRIPTION OF THE PREFERRED EMBODIMENTS

Figure 1:
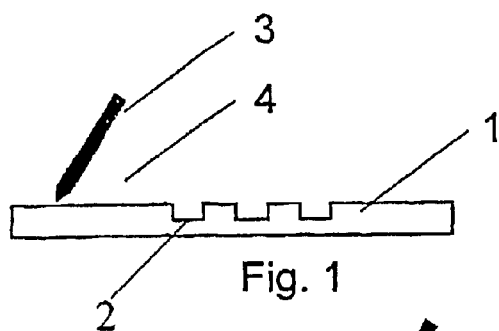
FIGS. 1 to 7 show the individual process steps of pad printing by a continuous method using a pad roll.
Figure 2:
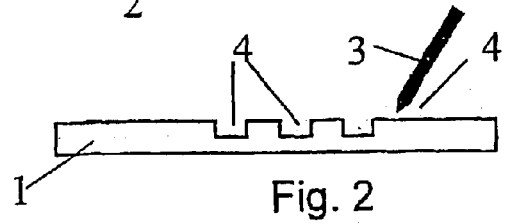
Figure 3:
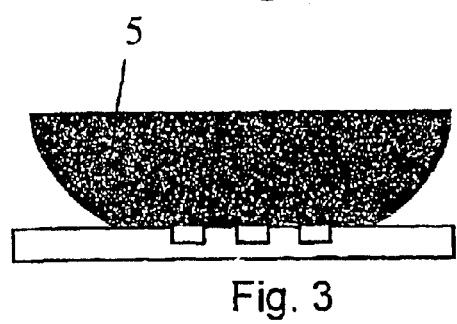
Figure 4:
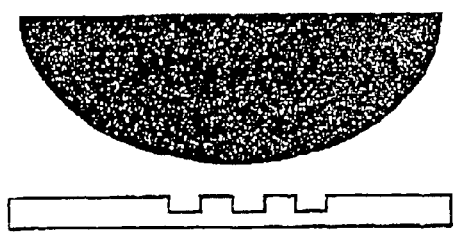
Figure 5:
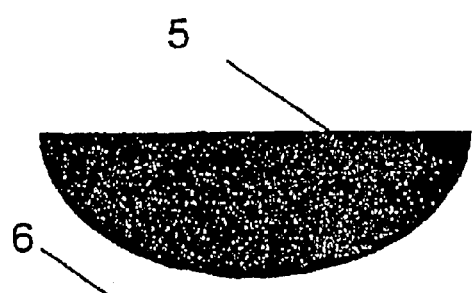
Figure 6:
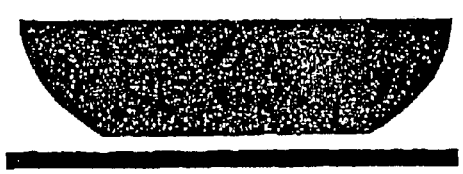
Figure 7:
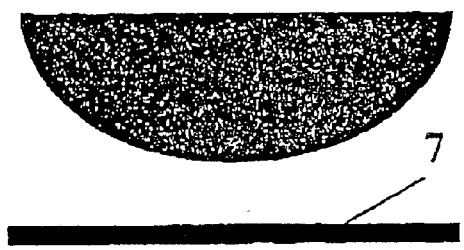

Firstly, the block 1 with the negatives 2 of the structure to be applied is shown in FIG. 1. Before the negative imprinting, it is possible to discern a doctor blade 3, which applies the functional polymer 4 along the block by blade. In FIG. 2, the negative 2 of the block is filled with functional polymer 4 and the doctor blade continues to slide precisely with the remainder of polymer on the block 1, which can rotate, for example. FIG. 3 reveals the large pad roll 5, which takes up the finished patterned functional polymer 4 from the block 3 and (cf. FIGS. 4 to 7) images it onto a substrate 6. The finished applied and patterned OFET 7 can be seen in FIG. 7.

Figure 8:
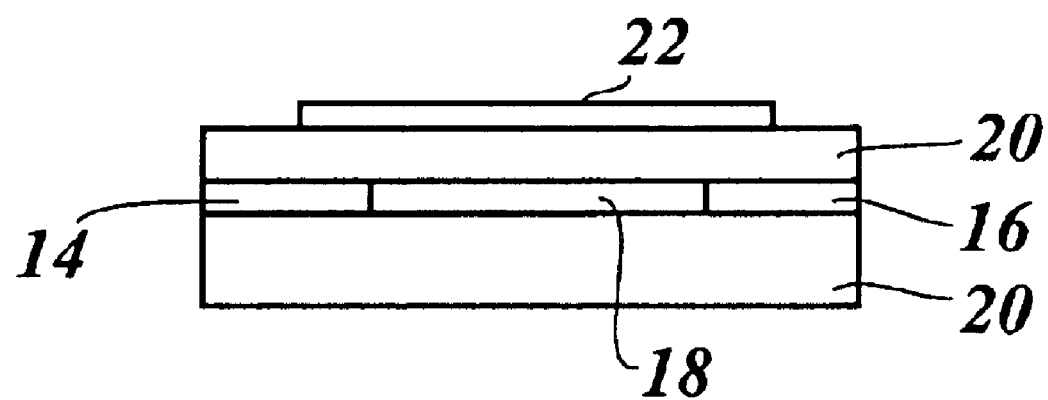
FIG. 8 is a side elevation sectional view of an OFET according to an embodiment of the present invention.

An OFET as described above is shown in more detail in FIG. 8 wherein the OFET 10 includes a substrate 12, a source 14, a drain 16, a semiconductor layer 18, an insulator layer 20 and a conductor layer 22.

The invention provides a cost-effective and precise method for producing and patterning OFETs by utilizing the solubility of at least one functional polymer of an OFET insofar as the functional polymer is applied to the prepared OFET or a substrate like an ink by means of a conventional printing method. The production method can be used for the cost-effective production of product and/or identification tags.

In contrast to the conventional method, by means of which only the conductor layer of an OFET can be patterned and the other layers of the OFET remain unpatterned, the printing process proposed by the invention is not material-specific, i.e. any arbitrary conductive polymer can be printed. Thus, both polyaniline and polypyrrol and further conductive polymers can be patterned with the aid of the printing method onto the substrate for the purpose of forming the OFET. The "lithography method" does not make sense for patterning the nonconductive layers of the organic transistor (semiconductor and insulator), for cost reasons. Only the printing according to the invention is actually appropriate here, for lack of other patterning methods.

What is claimed is:

1. A method for producing an OFET by printing at least one functional polymer onto a substrate, the functional polymer first being applied in an ink-like consistency and then being printed onto the substrate using a printing method by which color images are produced using a functional polymer.

2. The method as claimed in claim 1, in which a pad printing method is employed.

3. The method as claimed in claim 1, in which a pad made of silicone is employed.

4. The method as claimed in claim 1, in which a pad roll is employed in a continuous process.

5. The method as claimed in claim 1, in which the functional polymer is brought to an ink-like consistency by introduction into a solvent.

6. The method as claimed in claim 1, in which a resolution and/or patterning in the $\mu$m range is realized.

7. A method for producing an OFET by printing at least one functional polymer onto a substrate, the functional polymer first being applied in an ink-like consistency and then being printed onto the substrate in which a pad printing method is employed.

8. A method for producing an OFET by printing at least one functional polymer onto a substrate, the functional polymer first being applied in an ink-like consistency and then being printed onto the substrate in which a pad made of silicone is employed.

9. A method for producing an OFET by printing at least one functional polymer onto a substrate, the functional polymer first being applied in an ink-like consistency and then being printed onto the substrate in which a pad roll is employed in a continuous process.

10. A method for producing an OFET by printing at least one functional polymer onto a substrate, the functional polymer first being applied in an ink-like consistency and then being printed onto the substrate in which a resolution and/or patterning in the $\mu$m range is realized.

* * * * *